United States Patent [19]

Hayashida et al.

[11] 4,442,413
[45] Apr. 10, 1984

[54] TELEVISION RECEIVER PHASE LOCKED LOOP TUNING ARRANGEMENT

[75] Inventors: Shizuo Hayashida; Akinori Masuko, both of Saitama, Japan

[73] Assignee: Tokyo Shibaura Denki Kabushiki Kaisha, Kawasaki, Japan

[21] Appl. No.: 423,305

[22] Filed: Sep. 24, 1982

Related U.S. Application Data

[63] Continuation of Ser. No. 137,966, Apr. 7, 1980, abandoned.

[30] Foreign Application Priority Data

Apr. 10, 1979 [JP] Japan ................................. 54-43345

[51] Int. Cl.³ ............................................. H03L 7/16
[52] U.S. Cl. ..................................... 331/1 A; 331/25; 455/182; 455/260; 358/195.1
[58] Field of Search ............................. 331/1 A, 18, 25; 455/255, 257–260, 263–265, 182–183, 76–77; 358/191.1, 195.1

[56] References Cited

U.S. PATENT DOCUMENTS

| 4,109,283 | 8/1978 | Rast ....................................... 455/182 |
| 4,344,045 | 8/1982 | Das et al. .............................. 331/1 A |
| 4,355,416 | 10/1982 | Malerba ........................... 455/183 X |
| 4,360,832 | 11/1983 | Rzeszewski ...................... 358/191.1 |

FOREIGN PATENT DOCUMENTS

| 1538295 | 1/1979 | United Kingdom . |
| 1540459 | 2/1979 | United Kingdom . |
| 1550413 | 8/1979 | United Kingdom . |
| 1553366 | 9/1979 | United Kingdom . |
| 1561544 | 2/1980 | United Kingdom . |
| 1581525 | 12/1980 | United Kingdom . |
| 1588598 | 4/1981 | United Kingdom . |

OTHER PUBLICATIONS

Hilliker, "Simplified TV Tuning System", IEEE Transactions on Consumer Electronics, Feb. 1976, pp. 61–68.

Primary Examiner—Siegfried H. Grimm
Assistant Examiner—Edward P. Westin
Attorney, Agent, or Firm—Cushman, Darby and Cushman

[57] ABSTRACT

In a channel selection system of a television receiver set using a frequency synthesizer system, the local oscillator output of a voltage controlled oscillator in a tuner is coupled to through a prescaler to a programmable frequency divider. To a frequency division ratio specification input terminal of the programmable frequency divider is coupled a frequency division ratio setting data from a frequency division ratio memory. When the broadcast wave frequency is deviated from a predetermined value due to the frequency division ratio setting data, a fine tuning data corresponding to the deviation and a direction specification data representing the direction of the deviation are memorized in a random-access memory (RAM). The fine tuning data read out from the RAM is coupled to a fine tuning signal generator where it is added to or subtracted from the frequency division ratio setting data prevailing in the programmable frequency divider. The data obtained from the fine tuning signal generator as a result of the addition or subtraction is coupled as a new frequency division ratio setting data to a frequency division ratio specification input terminal of the programmable frequency divider.

8 Claims, 6 Drawing Figures

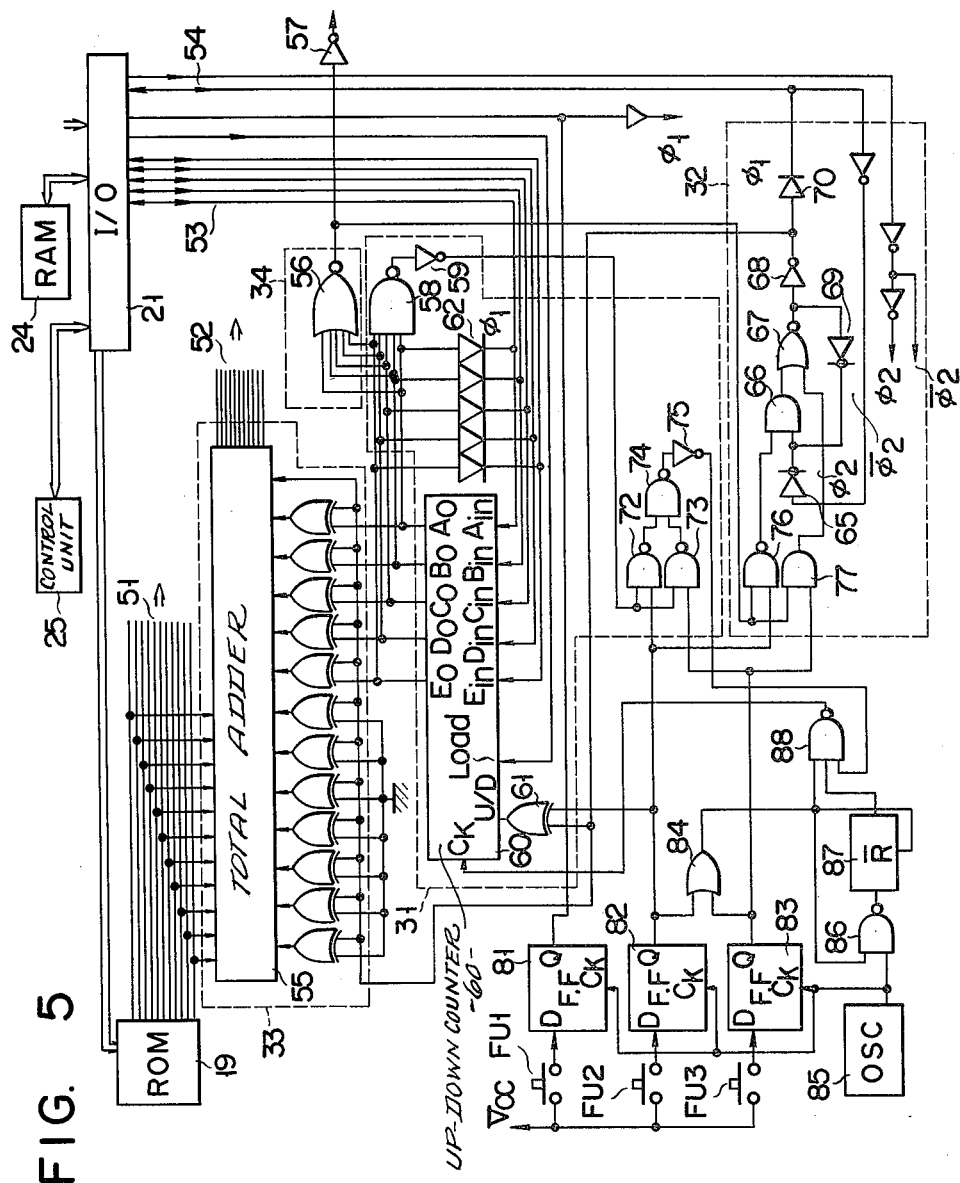
F I G. 5

TELEVISION RECEIVER PHASE LOCKED LOOP TUNING ARRANGEMENT

This is a continuation of application Ser. No. 137,966 filed Apr. 7, 1980, now abandoned.

This invention relates to a oscillation frequency control means for a PLL system oscillator.

As a tuning system of a CTV, a PLL frequency synthesizer system has been developed. Usually, the PLL frequency synthesizer system includes a loop constituted by a voltage controlled oscillator, a prescaler, a programmable frequency divider, a phase comparator and a low-pass filter. The output of a reference oscillator is frequency divided by a fixed frequency divider and coupled to one input terminal of the phase comparator, and the output of the voltage controlled oscillator is frequency divided by the prescaler and programmable frequency divider and then coupled to the other input terminal of the phase comparator. The frequency division ratio of the programmable frequency divider is determined by the output code from a coder converter, which is controlled by a channel selector. This ratio determines a desired channel. The channel selector has a memory which memorizes data corresponding to a plurality of channels. When the tuning system is operated to select a channel, a data corresponding to the desired channel among the data for the plurality of channels is read out from the memory.

According to the data read out from the memory a corresponding frequency division ratio of the programmable frequency divider is selected to select the desired channel. It is now assumed that the desired channel is channel No. 1, the corresponding frequency division ratio is a first frequency division ratio, and the data read out from the memory circuit at this time is a first data. In the usual tuning system, when channel No. 1 is tuned in, the first frequency division ratio and first data are maintained constant, with the oscillation frequency of the voltage controlled oscillator in the loop held locked at a predetermined value.

Meanwhile, the CVT is provided with an automatic fine tuning (AFT) circuit. This AFT circuit controls the oscillation frequency of a local oscillator to maintain constant i-f frequencies of an i-f stage. It includes a frequency discriminator for detecting the deviation of the i-f frequency of the i-f stage. The frequency discriminator produces a d-c voltage, which is coupled to the voltage controlled oscillator of the tuner for controlling the oscillation frequency of the local oscillator.

As the AFT circuit, there is one in which the AFT action is provided for the frequency synthesizer. In this method, fine tuning data corresponding to the i-f frequency deviations are previously memorized in the memory. When a channel of a large broadcast wave frequency deviation is selected by the frequency synthesizer system, the fine tuning data corresponding to the selected channel is read out from the memory circuit.

According to the fine tuning data thus read out the frequency division ratio of a variable frequency divider to frequency divide the output of the reference oscillator is corrected, and in this way the oscillation frequency of the voltage controlled oscillator is controlled. In this frequency synthesizer system the output of the voltage controlled oscillator is coupled after frequency division through the variable frequency divider to the phase comparator. In this system, which uses the variable frequency divider, the frequency division ratio (N) of the programmable frequency divider and the frequency division ratio (R) of the aforementioned variable frequency divider are set when a channel is selected.

In this system, there holds a relation $$f_0 = \frac{M \cdot N \cdot f_r}{R} = M \cdot f_r \cdot \frac{N}{R} \text{ or } N = \frac{f_0 \cdot R}{M \cdot f_r}$$

where $f_0$ is the oscillation frequency of the voltage controlled oscillator, M is the frequency division ratio of the prescaler, N is the frequency division ratio of the programmable frequency divider, R is the frequency division ratio of the variable frequency divider (which divides the frequency of the output of the reference oscillator), and $f_r$ is the oscillation frequency of the reference oscillator. The prescaler has a role of dividing the oscillation frequency of the voltage controlled oscillator to a frequency within a frequency coverage of the programmable frequency divider, and its frequency division ratio is fixed.

It will be seen that in the above equation N and R are variables. Generally, either N or R is made variable in the frequency synthesizer system. Where R is made variable, the frequency resolution at the time of fine tuning varies with the individual channels.

It is assumed that M=64 and $f_r$=4 MHz. Since the oscillation frquency $f_0$ for the first channel is 150 MHz, assuming the frequency division ratio of the variable frequency divider at this time to be R=1,024 the frequency division ratio $N_1$ of the programmable frequency divider is $$N_1 = \frac{f_0 \cdot R}{M \cdot f_r} = \frac{150 \times 1,024}{64 \times 4} = 600$$

In other words, when channel No. 1 is being received, there is a relation $$f_0(=150) = \frac{M(=64) \times N_1(=600) \times f_r(=4)}{R(=1,024)}$$

If the frequency division ratio R of the variable frequency divider here is changed to R+1, the oscillation frequency is changed to $$\frac{M \cdot N_1 \cdot f_r}{R+1} = \frac{64 \times 600 \times 4}{1,024 + 1} = 149.85365 \text{ MHz}$$

since 150 MHz−149,8536 MHz=146.35 KHz, the oscillation frequency is reduced by 146.35 KHz.

When it is desired to select channel No. 62, the required oscillation frequency $f_0$ is $f_0$=824 MHz, and in this case the frequency division ratio $N_2$ of the programmable frequency divider should be $$N_2 = \frac{824 \times 1,024}{64 \times 4} = 3,296$$

In other words, when channel No. 62 is being received, there holds a relation $$f_0(=824) = \frac{M(=64) \times N_2(=3,296) \times f_r(=4)}{R(=1,024)}$$

If the frequency division ratio R of the variable frequency divider at this time is changed to R+1, the oscillation frequency is changed to $$\frac{M \cdot N_1 \cdot f_r}{R+1} = \frac{64 \times 3{,}296 \times 4}{1{,}024 + 1} = 823.19609 \text{ MHz}$$

since 824 MHz−823.1960 MHz=803.9 KHz, the oscillation frequency is reduced by 803.9 KHz.

It will be seen from the above that by incrementing the frequency division ratio R by 1 at the time when channel No. 1 is being received the oscillation frequency of the voltage controlled oscillator is reduced by 146.35 KHz, while incrementing the frequency division ratio R by 1 at the time when channel No. 62 is being received reduces the voltage controlled oscillator frequency by 803.9 KHz. Obviously, there is a great difference in the frequency resolution between channel No. 1 and channel No. 62. This means that the broadcast wave frequency deviation can be adjusted in fine steps in case when the channel No. 1 is received but cannot in case when channel No. 62 is received. This results from the fact that R is made variable.

An object of the invention is to provide a oscillation frequency control means for PLL system oscillator, with which frequency division ratio setting data determining the frequency division ratio of the programmable frequency divider of the frequency synthesizer system can be finely adjusted according to fine tuning data, and which can thus provide for the same frequency resolution of fine tuning for all the channels.

The control system according to the invention comprises a voltage controlled oscillator, a prescaler for frequency dividing the oscillation output of the voltage controlled oscillator, a programmable frequency divider receiving the output of the prescaler, a comparator circuit for comparing the output of the programmable frequency divider and the output of a reference oscillator and controlling the oscillation output of the voltage controlled oscillator according to an output corresponding to the frequency difference and phase difference between the two compared outputs, and a means for controlling the frequency division ratio of the programmable frequency divider, and thus it enables fine tuning of the tuning frequency of the tuner over a broad (i.e., VHF and UHF) reception band as well as providing the same frequency resolution for fine tuning for all the channels.

This invention can be more fully understood from the following detailed description when taken in conjunction with the accompanying drawings, in which:

FIGS. 5 and 6 form a circuit diagram showing the detailed circuit construction of the fine tuning signal generating circuit shown in FIG. 4.

Figure 1:
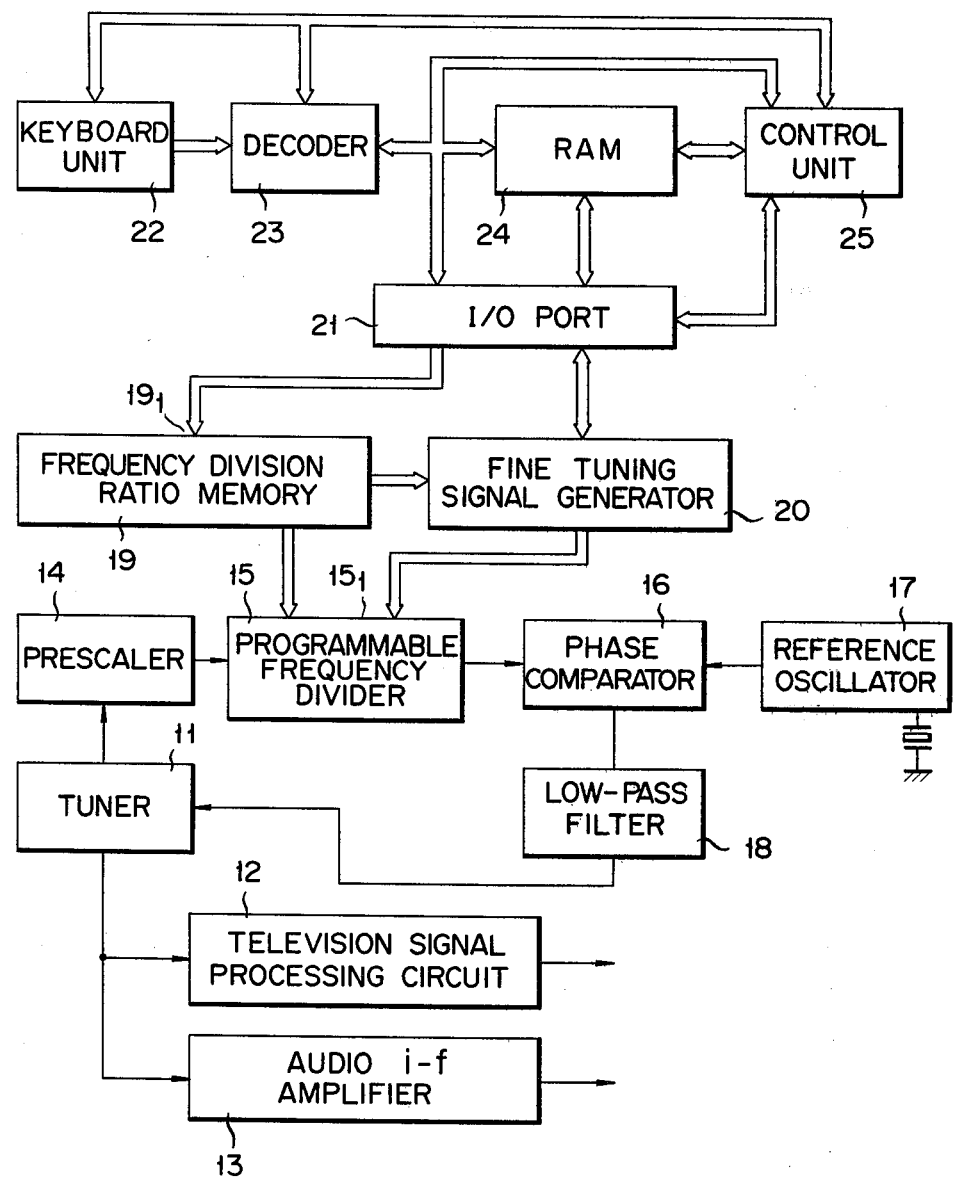
FIG. 1 is a block diagram showing the television receiver set control system according to the invention.

FIG. 1 shows a receiving system of a television receiver set. Designated at 11 is a tuner, which permits reception of a desired channel corresponding to a tuning voltage applied as terminal voltage across a variable capacitance diode. The tuner 11 includes an internal voltage controlled oscillator (which includes the variable capacitance diode), and with the application of the tuning voltage to the voltage controlled oscillator the local oscillator frequency and tuning frequency are set so that the desired channel can be selected. The television signal of the channel selected by the tuner 11 is coupled to a television signal processing circuit 12 and also to an audio i-f amplifier 13.

The output of the voltage controlled oscillator within the tuner 11 is coupled through a prescaler 14 to a programmable frequency divider 15. The frequency division output of the programmable frequency divider 15 is coupled to one input terminal of a phase comparator 16, which also receives at its other input terminal the output of a reference oscillator 17. The phase comparator 16 produces an output pulse voltage which is coupled through a low-pass filter 18 to an oscillation frequency control terminal of th voltage controlled oscillator in the tuner 11.

In this PLL frequency synthesizer, the output of the low-pass filter 18, which is a d-c voltage, can be varied by selectively setting the frequency division ratio of the programmable frequency divider 15, and this accomplished with coupling of data of various values to frequency division ratio specification input terminals of the programmable frequency divider 15. According to this output d-c voltage the local oscillator frequency in the tuner 11 is varied, whereby a desired channel can be selected. If the local oscillator frequency is changed in the receiving state of the tuner, the output d-c voltage of the low-pass filter 12 is also changed to change the output frequency of the voltage controlled oscillator in such a manner as to make up for the local oscillator frequency change. In this way, the stable receiving state of the tuner can be maintained.

When there is no information for fine frequency adjustment, the frequency division ratio of the programmable frequency divider 15 is set according to the output data from a frequency division ratio memory 19. The frequency division ratio memory 19 uses a ROM, and the output data therefrom are coupled to frequency division ratio specification input terminals $15_1$ of the programmable frequency divider 15. At the time of the fine frequency adjustment operation, the output data from a fine tuning signal generator 20 is coupled to the frequency division ratio specification input terminals $15_1$ to effect fine adjustment of the oscillation frequency of the voltage controlled oscillator.

The address of the area of the frequency division ratio memory 19, from which data is to be read out, is specified by the output of an input/output circuit (or I/O port) 21. To the I/O port 21 the output from a keyboard unit 22 is coupled through a decoder 23. The output of the decoder 23 is also coupled to address specification input terminals of a random-access memory (hereinafter referred to as RAM) 24. In a writing mode, output data from the RAM 24 are coupled through the I/O port 21 to the fine tuning signal generator 20. In a writing mode, output data from the fine tuning signal generator 20 can be written through the I/O port 21 to the RAM 24. The keyboard unit 22, decoder 23, RAM 24 and I/O port 21 are controlled for input and output timing and switching by control instruction signals from a control unit 25. As the control unit 25 a microcomputer may be used.

Figure 2:
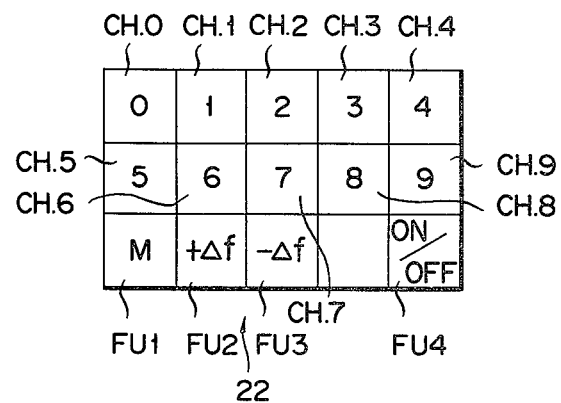
FIG. 2 is a view showing a switch arrangment of a keyboard unit shown in FIG. 1.

FIG. 2 shows the key arrangment of the keyboard unit 22. As is shown, the keyboard unit 22 has channel specification key switches CH.0 to CH.9 and function switches FU1 to FU4.

Figure 3:
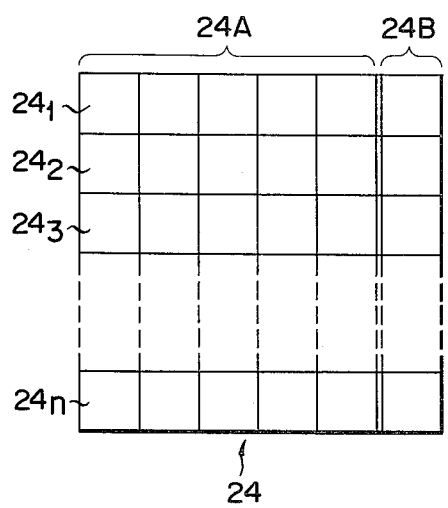
FIG. 3 is a view showing a data memory map of a random-access memory circuit shown in FIG. 1.

FIG. 3 shows the data memory map of the RAM 24. Individual memory areas $24_1$, $24_2$, ..., $24_n$ shown in FIG. 3 are provided for respective channels. Each memory area includes a (5-bit) fine adjustment data region 24A and a (1-bit) direction specification data region.

The relation between the keyboard unit 22 and RAM 24 will now be mentioned. By selectively operating two of the channel specification key switches CH.0 to CH.9 of the keyboard unit 11 one after another at the time when selecting a channel, two key switch signals are coupled in the order of operation of the key switches to the decoder 23. As a result, the decoder 23 produces a corresponding digital signal, which is coupled through the I/O port 21 to the frequency division ratio memory 19 which is constituted by a ROM, thus specifying an address therein, from which a frequency division ratio setting data is read out. With the reading-out of the data from the frequency division ratio memory 19 the television receiver set is rendered into a receiving state.

At this time, in the RAM 24 data concerning the fine frequency adjustment operation is read out from a section corresponding to the selected channel. The output data read out from the RAM 24 consist of a fine tuning data specifying a deviation of the voltage controlled oscillator frequency and a direction specification data specifying the direction of the deviation, and these data are coupled to the fine tuning signal generator 20.

For example, when the channel specification key switches CH.0 and CH.1 are consecutively operated in the mentioned order, a digital signal corresponding to channel No. 1 is produced from the decoder 23. This digital signal from the decoder 23 is coupled as address specification signal to a frequency division ratio read-out specification input terminal $19_1$ of the frequency division ratio memory 19, whereby a frequency division ratio setting data for selecting channel No. 1 is read out from the frequency division ratio memory 19. The digital signal from the decoder 23, produced by depressing channel specification key switch buttons, is also coupled to the RAM 24 to specify the address corresponding channel No. 1, and the fine tuning data and direction specification data are read out from the memory area of the specified address. The read-out fine tuning data and direction specification data are coupled through the I/O port 21 to the fine tuning signal generator 20. In the fine tuning signal generator 20, the frequency division ratio setting data is corrected according to the fine tuning data and direction specification data. (This process will be described later in detail with reference to FIGS. 4 and 5).

Of the data provided from the fine tuning signal generator 20, the fine tuning data is added to the prevailing frequency division ratio setting data if the direction specification data is "0", while it is subtracted from the frequency division ratio setting data if the direction specification data is "1".

The new frequency division ratio setting data which is obtained in the above arithmetic addition or subtraction process is coupled to the frequency ratio specification input terminal $15_1$ of the programmable frequency divider 15 for controlling the oscillation frequency of the voltage controlled oscillator. The direction specification data indicates that the antenna input frequency is deviated in the positive or negative direction in terms of "0" or "1" and controls the arithmetic processing with the data provided from the frequency division ratio memory 19 and fine tuning data, that is, it dictates either addition or subtraction. In other words, the output of the voltage controlled oscillator, i.e., the local oscillator frequency, is controlled in the increasing or reducing direction or held unchanged according to the direction specification data.

In case if right tuning, and hence best reproduction, cannot be obtained with the data read out from the RAM 24 at the time when, for instance, channel No. 1 is selected so that rewriting of the data through fine tuning operation is necessary, the oscillation frequency of the voltage controlled oscillator is varied by depressing either the function switch FU2, which permits the oscillation frequency to be increased, or the function switch FU3, which permits the oscillation frequency to be reduced. When either one of these switches FU2 and FU3 is depressed, the absolute value of the fine tuning data is varied within the fine tuning signal generator 20, and as a result the frequency division ratio of the programmable frequency divider 15 is also varied. When fine tuning data and direction specification data corresponding to the best reproduction state is obtained during this fine tuning operation, the function switch FU1, which has a function of permitting these data to be re-written in the RAM 24, is depressed. In this way, the new fine tuning data and direction specification data at this time are written through the I/O port 21 to the RAM 24. After the new data are re-written in the RAM 24 in this way, by operating the switches CH.0 and CH.1 in the keyboard unit 22 for selecting channel No. 1 the previously memorized fine tuning data for channel No. 1 is read out from the RAM 24, so that the best reproduction state can be obtained.

Denoting the local oscillator frequency of the tuner by $f_0$, $$f_0 = n_{pre} \cdot N \cdot f_r \text{ or } N = \frac{f_0}{n_{pre} \cdot f_r}$$

where $n_{pre}$ is the frequency division ratio of the prescaler, N is the frequency division of the programmable frequency divider, and $f_r$ is the reference frequency.

When selecting channel No. 1, the local oscillator frequency has to be 150 MHz. In this case, assuming $n_{pre} = 64$ and $f_r = 1.25$ KHz, $$N = \frac{f_0}{n_{pre} \cdot f_r} = \frac{150 \times 10^3}{64 \times 1.25} = 1.875.$$

Thus, when receiving channel No. 1 a data corresponding to N = 1.875 is read out from the frequency division ratio memory 19. At this time, the reading can be effected by operating the keyboard unit 22. If at this time N is changed by 1 to N = 1,875 + 1 = 1,876 for fine tuning, the local oscillator frequency is changed to $$f_0 = n_{pre} \cdot N \cdot f_r = 64 \times 1,876 \times 1.25 = 150,080 \text{ (KHz)}.$$

Thus, with the change of N by 1 a frequency change by 80 KHz can be obtained. Likewise, with the change of N by 2 to N = 1,878 the frequency $f_0$ is changed to $f_0 = 150,160$ KHz, and a frequency change by 160 KHz can be obtained. In this way, a frequency change by 80 KHz can be obtained for every change of N by 1.

When selecting channel No. 62, the local oscillator frequency has to be 842 MHz. In this case, the frequency division ratio N is $$N = \frac{f_0}{n_{pre} \cdot f_r} = \frac{824 \times 10^3}{64 \times 1.25} = 10,300$$

Thus, when receiving channel No. 62 a data corresponding to N=10,300 is read out from the frequency division ratio memory 19. If at this time N is changed by 1 to N=10,300+1=10,301 for fine tuning, the local oscillator frequency is changed to $$f_0 = N_{pre} \cdot N \cdot f_r = 64 \times 10,301 \times 1.25 = 824,080 \text{ (KHz)}.$$

Thus, with the change of N by 1 a frequency change by 80 KHz can be obtained. Likewise, with the change of N by 2 to N=10,302 the frequency $f_0$ is changed to $f_0$=824,160 KHz, and a frequency change by 160 KHz can be obtained. It will thus be seen that even in case when channel No. 62 is received, a frequency change by 80 KHz can be obtained for every change of N by 1.

As has been shown, for shifting the local oscillator frequency by 80 KHz either fine tuning data "+1" or "−1" may be added to N. Likewise, for shifting the local oscillator frequency by 160 KHz N may be changed by 2, and for a frequency shift by 360 KHz N may be changed by 3. It is to be appreciated that the same rate of frequency change (namely 80 KHz per unit of N) can be obtained by fine adjustment of N for any channel. This means that it is possible to obtain the same frequency resolution for fine tuning for all channels. Also, this means that it is possible to obtain fine adjustment of the receiving frequency over a board (i.e., VHF and UHF) receiving band.

Figure 4:
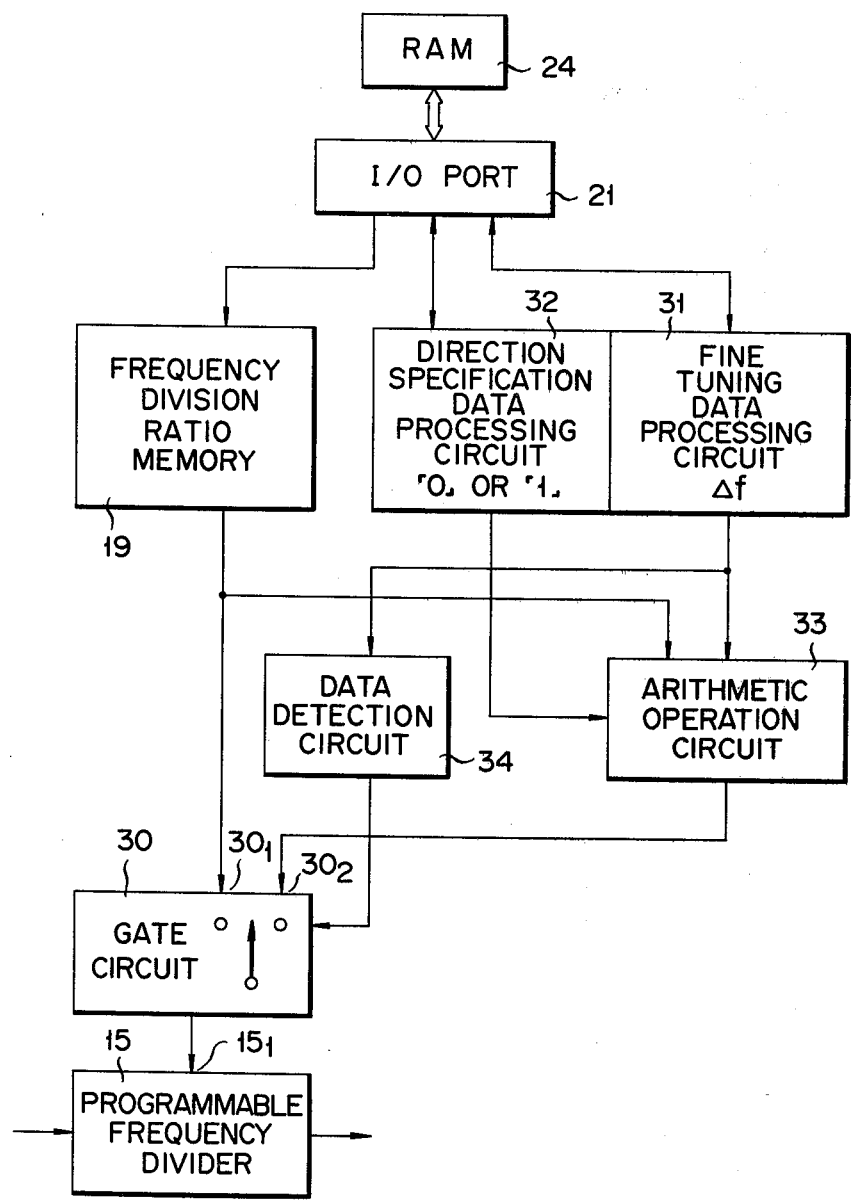
FIG. 4 is a block diagram showing a fine tuning signal generating circuit in the system of FIG. 1.

FIG. 4 shows a fine tuning signal generating circuit. The output of the frequency division ratio memory 19 is coupled to one input terminal of a gate circuit 30. The output of the gate circuit 30 is coupled to the frequency division ratio specification input terminal 15₁ of the programmable frequency divider 15. A fine tuning data processing circuit 31, which is coupled to the I/O port 21, provides an output to one input terminal 30₁ of an arithmetic operation circuit 33, which also receives at its other input terminal the frequency division ratio setting data from the frequency division ratio memory 19, and the addition or subtraction operation of the arithmetic operation circuit 33 is controlled by an output coupled thereto from the I/O port 21 through a direction specification data processing circuit 32. Here, the fine tuning data is read out from the fine tuning data region 24A in the RAM 24, and the direction specification data is read out from the direction specification region 24B in the RAM.

The output of the arithmetic operation circuit 33 is coupled to the other input terminal 30₂ of the gate circuit 30. The gate circuit 30 selectively passes data coupled to either one of its input terminals, namely either the output of the frequency division ratio memory 19 or the output of the arithmetic operation circuit 33, according to a control signal provided from a data detection circuit 34. The selectively passed data is coupled to the frequency division ratio specification input terminal of the programmable frequency divider 15. The arithmetic operation circuit 33 either adds together the frequency division ratio setting data from the frequency division ratio memory 19 and fine tuning data from the fine tuning data processing circuit 31 or subtracts these data one from the other, and the result can be coupled through the gate circuit 30 to the frequency division ratio specification input terminal 15₁ of the programmable frequency divider 15.

Figure 6:
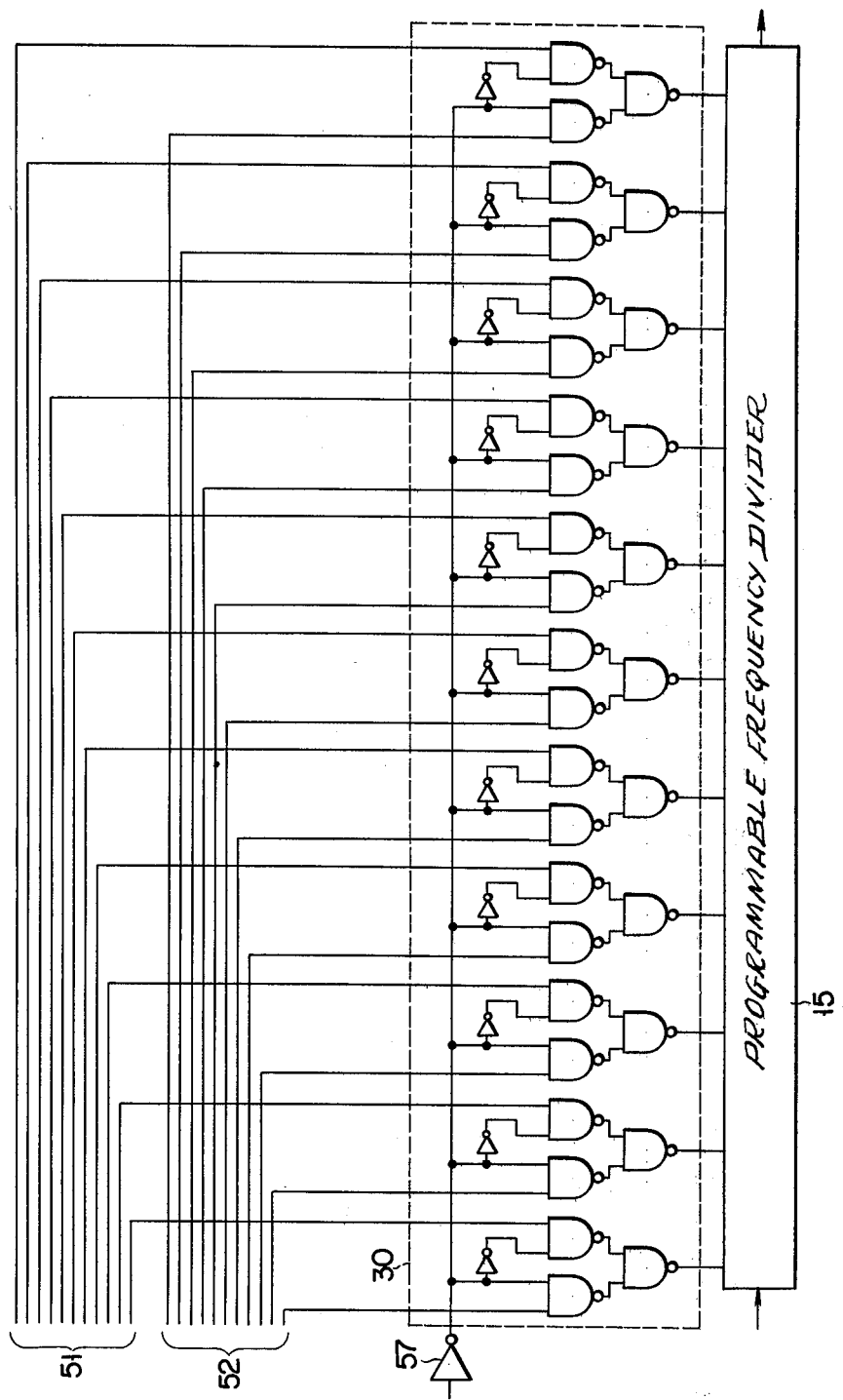

FIGS. 5 and 6 show the circuit of FIG. 4 in further detail. When a channel is selected by the keyboard unit 22, the corresponding frequency division ratio setting data is read out from the frequency division ratio memory 19 consisting of the ROM. The frequency division ratio setting data read out is coupled through a line group 51 to one input terminal of an 11-bit total adder 55. Meanwhile, the fine tuning data read out from the RAM 24 is coupled through the I/O port and a line group 53 to an input terminal group of a presettable up-down counter 60. Also, the direction specification data ("0" or "1") is coupled through a line 54 to the direction specification data processing circuit 32.

In the presettable up-down counter 60, the fine tuning data is read in under the control of a data read timing pulse signal $\phi_2$ coupled to a load terminal. The direction specification data is latched in the direction specification data processing circuit 32 in a timing determined by a clock pulse signal $\phi_2$.

At this time, if the fine tuning data from the RAM 24 are all "0", a control signal is coupled from a NOR circuit 56, which constitutes the data detection circuit 34, through an inverter 57 to the gate circuit 30 (which is shown in FIG. 6). The gate circuit 30 selectively passes either data coupled through the line group 51 connected to the frequency division ratio memory 19 or data coupled through the line group connected to the output side of the total adder 55 to the frequency division ratio specification input terminal of the programmable divider 15 according to the control signal from the data detection circuit 34. Thus, if the fine tuning data are all "0", the data coupled through the line group 51 is selected and coupled to the frequency division ratio specification input terminal of the programmable frequency divider 15.

When fine frequency adjustment is required and a fine tuning data is provided, the direction specification data processing circuit 32 determines either up-counting or down-counting operation of the presettable up-down counter 60 according to the direction specification data. It also determines either addition or subtraction operation of the total adder 55 according to the direction specification data. The total adder 55 executes addition when a carry input "0" is coupled from the direction specification data processing circuit 32, while it executes subtraction when a carry input "1" is coupled. To the other input terminal group of the total adder 55 is coupled the fine tuning data produced from the presettable up-down counter 60. The total adder 55 adds the frequency division ratio setting data from the frequency division ratio memory 19 and fine tuning data from the presettable up-down counter 60 or subtracts these data one from the other, and the result is coupled through the line group 52 and gate circuit 30 to the frequency division ratio specification input terminal of the programmable frequency divider 15. At this time, the gate circuit 30 is switched to pass either the data coupled through the line group 51 or data coupled through the line group 52 by the output from the NOR circuit 56.

In case when the correction of the oscillation frequency of the voltage controlled oscillator cannot be accomplished with the data read out from the RAM 24, the function switch FU2 or FU3 is operated. The operation of the function switch FU2 or FU3 controls a corresponding D-type flip-flop 82 or 83. For example, when the function switch FU2 is depressed for correcting the oscillation frequency, the output of the D-type flip-flop 82 becomes "1", which is coupled through an exclusive OR circuit 61 to the presettable up-down counter 60 to switch the counter 60 into an up-counting mode. Also, the "1" output of the D-type flip-flop 82 permits the output of an oscillator 85 to be coupled through an AND circuit 86, a frequency divider 87 and a NAND circuit 88 to a clock pulse input terminal $C_k$ of the presettable up-down counter 60. The "1" output of the D-type flip-flop 82 is further coupled to a second input terminal of the NAND circuit 72. Thus, by depressing the function switch FU2 an up-count command is delivered from the exclusive OR circuit 61 to the presettable up-down counter 60, and a clock pulse signal is supplied from the NAND circuit 88 so that the presettable up-down counter 60 is held in the up-counting mode during a period, during which the function switch FU2 is held depressed.

With the commencement of the counting operation of the presettable up-down counter 60, the data from its output terminal group (i.e., fine tuning data) is varied. The data being varied is coupled to the outer input terminal group of the total adder 55. The result data from the total adder 55 is coupled through the line group 52 and gate circuit 30 to the frequency division ratio specification input terminal of the programmable frequency divider 15 unless the fine tuning data is all "0".

Now, what happens when the up-counting operation is ended as a result of continuously depressing the function switch FU2 will be discussed. By continuously depressing the function switch FU2 for fine frequency adjustment, the up-counting operation of the presettable up-down counter 60 proceeds so that ultimately all the output terminals thereof come up with data "1", whereupon the output of a NAND circuit 59 becomes "0" so that the two inputs to a NAND circuit 72 both become "1". Since at this time the two inputs to a NAND circuit 73 are "1" and "0", that is, since the output thereof is "1", a NAND circuit 74 produces an output "1", which is inverted by an inverter 75 to "0" to inhibit clock pulse input to the presettable up-down counter 60. In this way, when the up-counting operation of the presettable up-down counter 60 is continued until all the output bits therefrom become "1", no further clock pulse is coupled thereto, so that the up-counting operation is stopped.

Now, what happens when the function switch FU3, which permits reduction of the oscillation frequency of the voltage controlled oscillator, is depressed in the state of the presettable up-down counter 60 with all the output bits thereof being "1" will now be discussed. By depressing the function switch FU3 in this state, the presettable up-down counter 60 is caused to perform down-counting since both the inputs to the exclusive OR circuit 61 are "0". At this time, the total adder 52 performs addition, but since the presettable up-down counter 60 performs down-counting the value of the output of the total adder 55 is progressively reduced. When the down-counting operation of the presettable up-down counter 60 is continued until the output bits thereof all become "0", this state is detected by a NOR circuit 56, which thus produces an output "1". As a result, the direction specification data processing circuit 32 is reset, with its output changed from "0" to "1", whereupon the presettable up-down counter 60 is switched to the up-counting mode. Also, with the inversion of the output of the direction specification data processing circuit 32 from "0" to "1" the operation of the total adder 52 is switched to addition.

As is shown, when the output bits of the presettable up-down counter 60 all become "0", its counting mode is switched from down-counting over to up-counting, while at the same time the output of the direction specification data processing circuit 32 is inverted. In other words, when all the output bits of the presettable up-down counter 60 become "0" to switch the counting mode thereof to the up-counting, the absolute value of the fine tuning data turns to increase while the sign of the data is inverted, so that the output of the total adder 55 is progressively reduced. When the output bits of the presettable up-down counter 60 all become "1" again, the NAND circuit 58 detects this and stops the counting operation.

The direction specification data processing circuit 32 includes a clocked inverter 65, an AND circuit 66, a NOR circuit 67, an inverter 68, a transfer gate 70 and a clocked inverter 69. It can latch the direction specification data coupled to it from the I/O port 21 through the line 54. Also, it is reset by a "0" output from a NAND circuit 76 and set by a "1" output from an AND circuit 77.

The fine tuning data and direction specification data, which are obtained by depressing the function switch FU2 or FU3, are memorized in the RAM by depressing the function switch FU1, and this will now be discussed in detail.

By releasing the function switch FU2 when optimum fine tuning and direction specification data are obtained as the switch FU2 is held depressed, the output of the D-type flip-flop circuit 82 becomes "0" to stop the counting operation. At this time, by depressing the function switch FU1, which has the function of permitting the afore-mentioned data to be written in the RAM 24, the output of a D-type flip-flop circuit 81 becomes "1" to produce a data write-in clock pulse signal $\phi_1$.

As a result, a write-in control pulse signal $\phi_1$, which controls the writing of the fine tuning data and direction specification data for controlling the oscillation frequency of the voltage controlled oscillator to an adequate value in the RAM, causes the fine tuning data to be coupled from the output terminal group of the presettable up-down counter 60 through a transfer gate group 62 and a line group 53 to the I/O port 21. The clock pulse signal $\phi_1$ also drives the transfer gate 70 for writing the direction specification data through the I/O port 21 to the RAM 24, whereby the direction specification data having been latched in the direction specification data processing circuit 32 is coupled through the line 54 to the I/O port 21. The fine tuning data and direction specification data coupled to the I/O port 21 are memorized in the RAM 24 in memory areas thereof having a corresponding address as shown in FIG. 3. In the case of operating the function switch FU3, the data obtained are memorized in the RAM 24 in a manner similar to the case of memorization of the data obtained by operating the function switch FU2, and no further description is given here for this case.

As has been described in the foregoing, the invention particularly features the use of fine tuning data as a variable factor of the frequency division ratio of the programmable frequency divider. With this frequency synthesizer system it is possible to obtain fine adjustment of the receiving frequency over a broad (i.e., VHF and UHF) receiving frequency band. In addition, the same frequency resolution for fine tuning is provided for all channels, so that fine tuning can be readily made.

What we claim is:

1. An oscillation frequency control arrangement for a phase-locked loop (PLL) system comprising:
   voltage controlled oscillator (VCO) means for providing a VCO signal at a signal output thereof responsive to a control signal;
   prescaler means, coupled to said signal output of said VCO means, for prescaling by frequency dividing said VCO signal and providing a prescaled signal at a prescaler output thereof;
   programmable frequency divider means, coupled to said prescaler output, for frequency dividing said prescaled signal in accordance with a controllable division ratio in response to a signal coupled to a control terminal thereof and providing a divided signal at a divider output thereof;
   reference oscillator means for providing a reference signal;
   phase comparator means, coupled to said reference oscillator means and to said programmable frequency divider means, for comparing said divided signal with said reference signal and generating a comparator signal corresponding to a frequency and phase difference between said compared signals;
   means, responsive to said comparator signal, for providing the control signal to said VCO;
   first frequency division ratio data generating means for generating first frequency division data providing coarse tuning information;
   second frequency division ratio data generating means for generating second frequency division data providing fine tuning information;
   arithmetic operation means for arithmetically combining said first and second frequency division ratio data and producing third frequency division ratio data for controlling the division ratio of said programmable frequency divider means; and
   means for selectively supplying first frequency division ratio data from said first frequency division ratio generating means and third frequency division ratio data from said arithmetic operation means to said control terminal of said programmable frequency divider means.

2. An oscillation frequency control arrangement according to claim 1, wherein said second frequency division ratio data generating means comprises:
   up-down counter means, having a clock input, for varying said second frequency division ratio data as used in said arithmetic operation means;
   first means for controlling said clock input of said up-down counter means; and
   second means, having a RAM and including said up-down counter means, for storing said second frequency division ratio data obtained by said first means and up-down counter means, said second means being adapted to read out said second frequency division ratio data stored in the RAM and supply it to said arithmetic operation means.

3. An oscillation frequency control arrangement for a phase-locked loop (PLL) system comprising:
   voltage controlled oscillator (VCO) means for providing a controlled frequency signal at a signal output thereof in response to a control signal applied thereto;
   prescaler means, coupled to said signal output of said VCO means, for frequency dividing said VCO signal and providing a prescaled signal at a prescaler output thereof;
   programmable frequency divider means, coupled to said prescaler for frequency dividing said prescaled signal according to a controllable division ratio N in response to a signal coupled to a control terminal thereof and providing a divided signal at an output thereof;
   reference oscillator means for providing a reference signal
   phase comparator means, coupled to said reference oscillator means and programmable frequency divider means for comparing said divider signal with said reference signal and generating said control signal for controlling said VCO means, said control signal corresponding to a frequency difference and phase difference between said compared signals;
   first frequency division data generating means for generating first frequency ratio data corresponding to coarse tuning data;
   second frequency division ratio data generating means for generating second frequency division ratio data corresponding to fine tuning data;
   arithmetic operation means for arithmetically combining said first and second frequency division ratio data and for generating third frequency division ratio data; and
   means for selectively supplying said first frequency division ratio data from said first frequency division ratio data generating means and third frequency division ratio data from said arithmetic operation means to said control terminal of said programmable frequency divider means to cause its division ratio N to be controlled in accordance with Equation (1) as follows $$N = [f_0/(n_{per} \times f_r)] \qquad (1)$$

where
   $f_0$: the oscillation frequency of said VCO means,
   $f_r$: the oscillation frequency of said reference oscillator means, and
   $n_{per}$: the frequency division ratio of said prescaler means.

4. An oscillation frequency control arrangement for a phase-locked loop (PLL) system, comprising:
   a voltage controlled oscillator (VCO),
   programmable frequency divider means for dividing, responsive to a control signal, a signal from said VCO;
   phase comparator means for comparing an output from said programmable frequency divider means with a reference oscillator signal and providing a comparator signal corresponding to a frequency and phase difference therebetween;
   low-pass filter means, for filtering said comparator signal and applying a substantially DC control signal to said VCO for controlling its frequency;;
   a read only memory (ROM) for storing frequency division ratio data for each channel to be tuned;
   a random access memory (RAM) for storing fine tuning data including direction designating data for each channel to be tuned;
   an up-down counter;

means for presetting said RAM fine tuning data into said up-down counter;

a keyboard coupled to said up-down counter for changing data preset into said up-down counter; and arithmetic combining means for combining said ROM frequency division ratio data with data in said up-down counter for generating said control signal for controlling the divide ratio of said programmable frequency divider means.

5. An oscillation frequency control arrangement according to claim 4, further including means for storing said fine tuning data into said RAM according to a write designation signal from said keyboard.

6. An oscillator frequency control arrangement according to claim 4, wherein said combining means comprises an arithmetic operation circuit for causing said fine tuning data read out of said RAM by a read instruction from said keyboard and frequency division ratio data read out of said ROM to be additively or subtractively combined according to said direction designating data.

7. An oscillation frequency control arrangement for a PLL system oscillation comprising a voltage controlled oscillator, a prescaler for frequency dividing the output of said voltage controlled oscillator, a programmable frequency divider receiving the output of said prescaler, a phase comparator for comparing the output of said programmable frequency divider and the output of a reference oscillator and controlling the output of said voltage controlled oscillator according to an output corresponding to the frequency difference and phase difference between said two compared outputs, and a means for controlling the frequency division ratio of said programmable frequency dividers, comprising:

a first memory for storing coarse division ratio information for each of a plurality of channels, a second memory for storing fine division ratio information and the sign of said fine division ratio information for each of said plurality of channels, a settable up/down counter which acts as a temporary store for said fine division ratio information from said second memory, a clock oscillator connected to the clock input of the counter through a gate, an adder/subtractor for adding or subtracting the outputs of the first memory and the up/down counter, detector means for detecting the null and full states of the up/down counter, and a control circuit connected to the second memory, the up/down counter, the adder/subtractor and the detector means for setting the direction of count of the counter and for setting the adder/subtractor to either its adding or its subtracting modes in accordance with the outputs of the second memory and the detecting means, and means for determining the frequency division ratio of said programmable frequency divider according to the output of said adder/subtractor so as to determine the oscillation frequency of said voltage controlled oscillator.

8. An oscillation frequency control means according to claim 7 wherein the detector means comprises a first detector for detecting the null count state of the up/down counter and a second detector for detecting the full count state of the up/down counter, the output of the first detector being connected to the control circuit.

* * * * *